United States Patent
Ramakrishnan et al.

[19]

[11] Patent Number: 5,915,188

[45] Date of Patent: Jun. 22, 1999

[54] INTEGRATED INDUCTOR AND CAPACITOR ON A SUBSTRATE AND METHOD FOR FABRICATING SAME

[75] Inventors: E. S. Ramakrishnan, Coral Springs; Douglas H. Weisman, Sunrise, both of Fla.

[73] Assignee: Motorola, Inc., Schaumburg, Ill.

[21] Appl. No.: 08/996,228

[22] Filed: Dec. 22, 1997

[51] Int. Cl.$^6$ .................................................. H01L 27/02

[52] U.S. Cl. ...................... 438/381; 257/375; 257/377; 257/531

[58] Field of Search .................. 438/394; 257/375, 257/377, 531

[56] References Cited

U.S. PATENT DOCUMENTS 4,471,405  9/1984  Howard et al. ......................... 361/305
5,083,236  1/1992  Chason et al. ......................... 361/401
5,492,856  2/1996  Ikeda et al. ............................ 438/394

*Primary Examiner*—Olik Chaudhuri
*Assistant Examiner*—William David Coleman
*Attorney, Agent, or Firm*—Dale W. Dorinski

[57] ABSTRACT

An integrated inductor-capacitor (L-C) structure can be formed on a semiconducting substrate (10) by depositing a metal layer in a pattern that contains an inductor coil (14) and a capacitor bottom electrode (12). A $CuFe_2O_4$ film (16) is then deposited on the substrate and over the metal pattern to form the dielectric portion of the L-C structure. A via (17) created in the $CuFe_2O_4$ film exposes a portion of the inductor coil. Another metal layer (18) is then deposited over the $CuFe_2O_4$ film and in the via, such that this metal layer is electrically connected to the inductor coil through the via. A pattern is also made in the second metal layer to form a top electrode (19) for the capacitor, over the corresponding capacitor bottom electrode, and to form a circuit interconnect to the inductor coil through the via.

12 Claims, 2 Drawing Sheets

INTEGRATED INDUCTOR AND CAPACITOR ON A SUBSTRATE AND METHOD FOR FABRICATING SAME

TECHNICAL FIELD

This invention relates to capacitors and inductors, and more particularly, to a method of making an integrated inductor-capacitor structure using the same dielectric material and thickness for both the inductor and capacitor

BACKGROUND

Integrated circuits are commonly made on semiconducting substrates of silicon or gallium arsenide. Integrated circuits used in radio frequency (RF) applications commonly contain inductors and capacitors in addition to the transistors. These inductors and capacitors are formed in the metal/oxide/metal (MIM) and metal/insulator/semiconductor (MIS) structures. In these cases, the dielectric film most commonly used to form the capacitors or inductors is silicon dioxide ($SiO_2$). The electric permeability of both the substrate and the $SiO_2$ dielectric is approximately one, and the dielectric constant of the $SiO_2$ is 3.9. Since the inductance (L) is proportional to the permeability and since capacitance (C) is proportional to the dielectric constant, the area that is occupied by the inductors and the capacitors is large in present day devices. Prior art technology manipulates both the thickness of the dielectric material and the area of the device itself as the variables to achieve the desired capacitance. Large area metal coil patterns are used to form inductors. These limitations make it difficult to achieve large values of inductance or capacitance in small devices and, thus, the designer is limited in the range of inductors and/or capacitors that may be formed on a semiconductor substrate. It would be highly desirable if high value L-C structures could be formed for radio frequency applications using a single material.

DETAILED DESCRIPTION OF THE PREFERRED EMBODIMENT

An integrated inductor-capacitor (L-C) structure can be formed on a semiconducting substrate by depositing a metal layer in a pattern that contains an inductor coil and a capacitor bottom electrode. A metal oxide film is then deposited on the substrate and over the metal pattern to form the dielectric portion of the L-C structure. A via is formed in the metal oxide layer so that a portion of the inductor coil is now exposed. Another metal layer is then deposited over the metal oxide layer and in the via, such that this metal layer is electrically connected to the inductor coil through the via. A pattern is also made in the second metal layer to form a top electrode for the capacitor, over the corresponding capacitor bottom electrode, and to form a circuit interconnect to the inductor coil through the via. Preferably, the metal oxide film is $CuFe_2O_4$.

Figure 1:
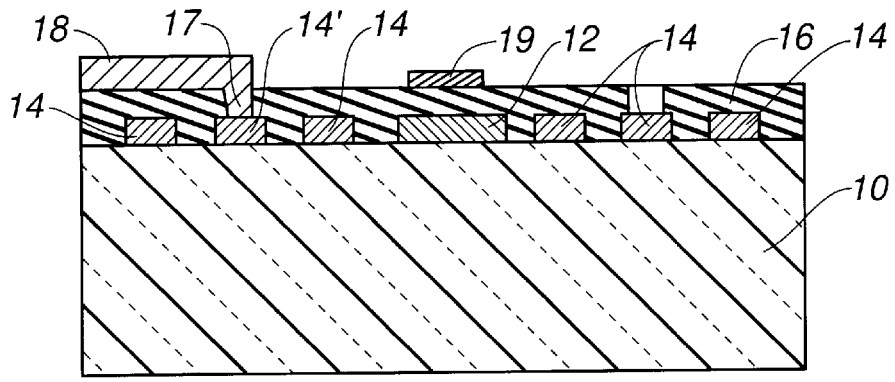
FIGS. 1–3 are cross-sectional views of three embodiments of L-C structures in accordance with the invention.

While the specification concludes with claims defining the features of the invention that are regarded as novel, it is believed that the invention will be better understood from a consideration of the following description in conjunction with the drawing figures, in which like reference numerals are carried forward, Referring to FIG. 1, a cross-sectional view of an L-C structure on a semiconductor in accordance with a first embodiment of the invention is shown. These drawings are intentionally not drawn to scale so that the features of interest might be better illustrated. A semiconducting substrate 10 is typically formed of silicon, gallium arsenide or an insulating substrate such as sapphire. Formed on the top surface of this substrate 10 is a thin film of a metallization pattern that contains the bottom electrode 12 of a capacitor and the coil 14 of an inductor. Although the inductor coil 14 and 14' is shown in cross-sectional view in FIG. 1, those skilled in the art will appreciate that inductor coils are typically formed in a spiral and a plan view of the inductor coil 14 would show that each of the individual cross-sectional segments are joined in a single continuous spiral. Superimposed over inductor coil 14 and the substrate 10 is a metal oxide layer 16. In the preferred embodiment, the metal oxide layer is $CuFe_2O_4$. The $CuFe_2O_4$ is typically applied by sputter deposition and in most applications, the thickness of the film typically ranges from 0.5 to 5 microns. Metal oxide layer 16 will subsequently serve to form the dielectric portion of the capacitor in the structure and also to serve as the dielectric between adjacent conductors 14 of the inductor. A via 17 is then formed in the metal oxide layer 16, typically using conventional photolithography processes. Those skilled in the art will appreciate that photoresist may be applied over the metal oxide layer 16, the photoresist image developed to create a pattern, and then the via 17 is etched in the metal oxide layer 16. Formation of the via 17 exposes at least one portion and sometimes more portions of the spiral inductor coil 14. A second metal layer is now deposited over the top of the patterned metal oxide layer 16. During this deposition process, metal is also deposited in the vias 17 in order to make an electrical interconnection to the underlying portion of the inductor coil 14'. This metal layer is subsequently patterned to form a capacitor top electrode 19 that lays directly over the capacitor bottom electrode 12 and also to form a circuit interconnect 18 that is connected thru via 17 to the underlying portion 14' of the inductor coil. Note that the same dielectric material 16 is used to form the dielectric material for the capacitor and for the inductor.

Figure 2:
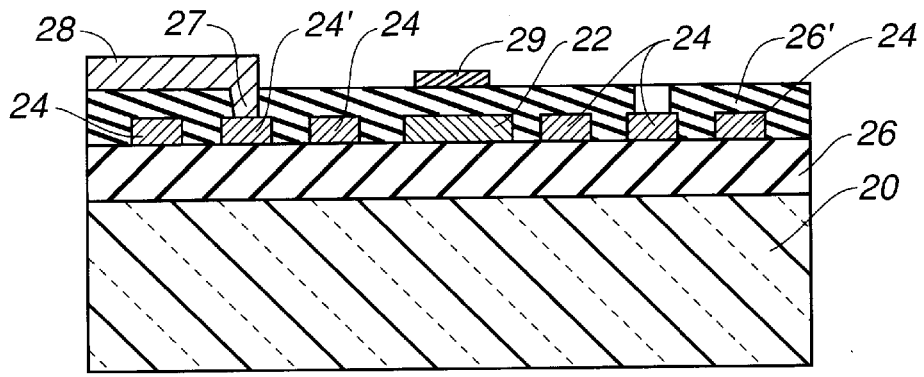

In an alternate embodiment of the invention shown in FIG. 2, a similar structure can be created by first depositing a metal oxide layer 26 of $CuFe_2O_4$ on top of semiconducting substrate 20. The capacitor bottom electrode 22 and the corresponding conducting coils 24 and 24' are formed on the insulator layer 26 in a manner similar to that described previously for FIG. 1. A second layer 26' of $CuFe_2O_4$ metal oxide is then deposited over the metallization pattern containing the capacitor bottom electrode in the inductor spiral, and vias 27 are formed in this metal oxide layer as previously described. A second metallization pattern is then deposited on top of the second metal oxide layer 26' and this metal layer is patterned to form the capacitor top electrode 29 and the circuit interconnect 28 that interconnects portions of the inductor coil to external circuitry.

Figure 3:
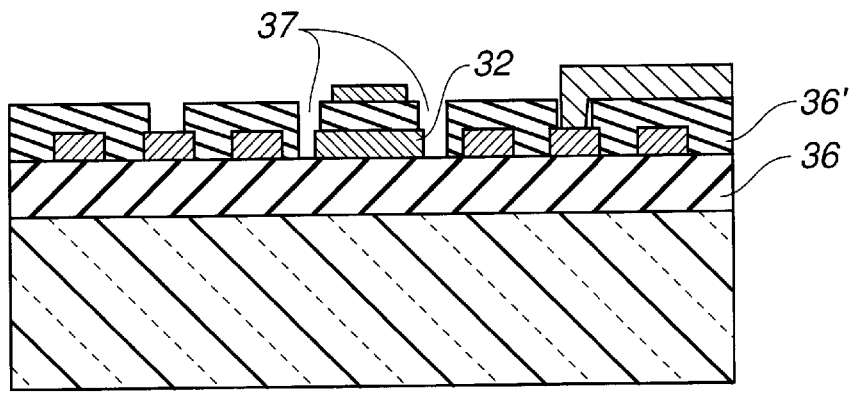

Referring now to FIG. 3, an alternate embodiment of the structure shown in FIG. 2 embraces vias 37 that extend completely through the metal oxide layer 36' to reveal portions of the surface of metal oxide layer 36. In so doing, portions of the capacitor bottom electrode 32 are now exposed by via 37. This allows a subsequent metallization step to make an external connection from the top of the circuit down to the bottom electrode 32.

Figure 4:
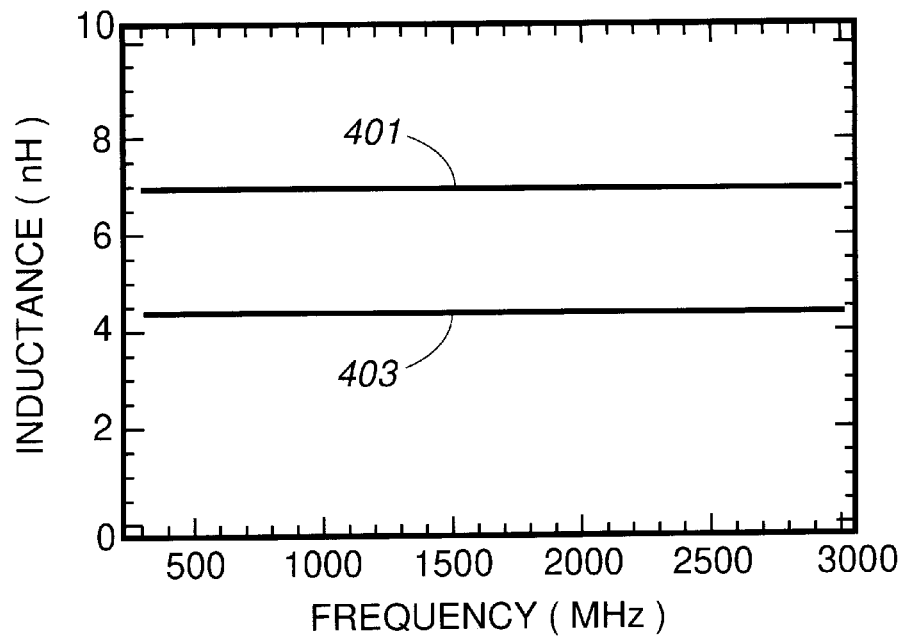
FIG. 4 is a chart of frequency vs. inductance of an inductor having a $CuFe_2O_4$ dielectric in accordance with the invention.
Figure 5:
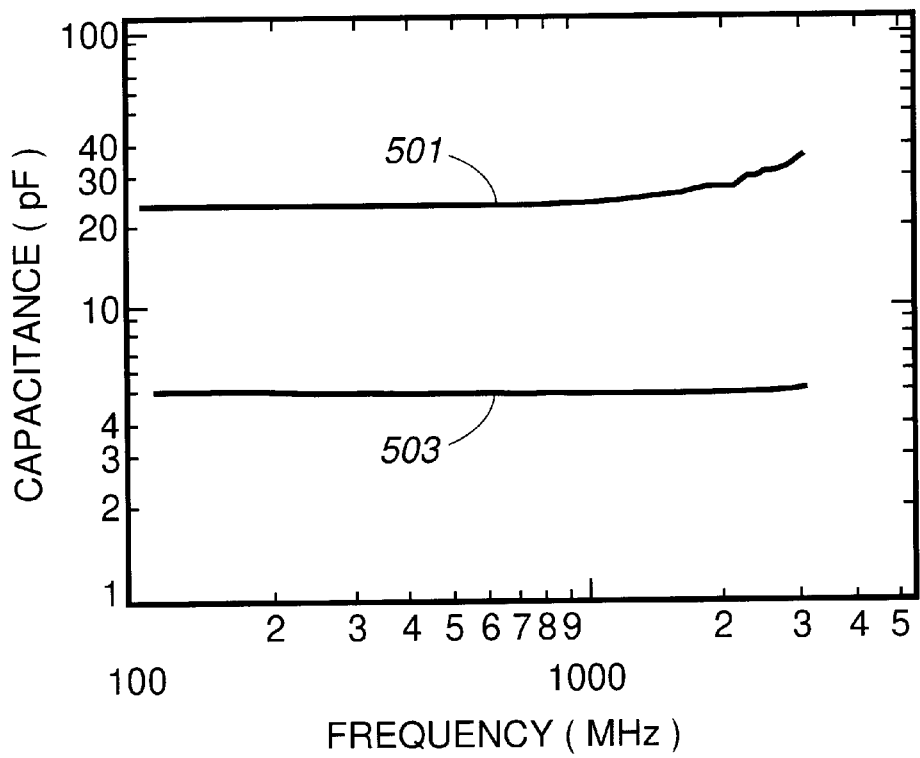
FIG. 5 is a chart of frequency vs. capacitance of two different sized capacitors having a $CuFe_2O_4$ dielectric in accordance with the invention.

Referring now to FIG. 4, the graph depicts the frequency versus inductance of a $CuFe_2O_4$ film. The lower line 403 shows the inductance of the bare semiconducting substrate, and the upper line 401 shows the inductance of the $CuFe_2O_4$ film deposited on the substrate. It can be seen that the inductance of the $CuFe_2O_4$ film is approximately 7 nanoHenrys, which is significantly higher than that of a conventional dielectric with a permeability of 1. Line 403, the bare substrate, has an inductance of 4.5 nanoHenrys. And, it can also be seen that the inductance 401 of the film is essentially constant over a wide frequency range. FIG. 5 shows the capacitance of two capacitors fabricated with $CuFe_2O_4$ film. The capacitor represented by line 501 had an area of $3.6 \times 10^{-3}$ cm$^2$ and that represented by line 503 had an area of $9 \times 10-4$ cm$^2$ centimeters. In both instances, it can be seen that the capacitance is also relatively constant over a wide frequency range.

Although we have created inductors and capacitors using $CuFe_2O_4$ thin films, it is also possible to use other materials such as $NiFe_2O_4$. The composite L-C structure fabricated in accordance with the invention shows values at least 50% greater than those fabricated with conventional dielectric materials. Dielectric constant of this material is approximately 16 and remains essentially constant over a very wide frequency range, thus providing four times greater capacitance than $SiO_2$ as used in the prior art. A single thin-film material, thus provides the advantage of creating a high-permeability inductor as well as a high-dielectric capacitor material.

In summary, we have shown that a combined inductor capacitor structure can be formed on a substrate using a single high-dielectric constant material with high permeability to yield L-C structures having heretofore unseen values. The L-C structure has consistent properties over a wide frequency range and can be manufactured using conventional techniques. Our invention provides L-C structures that have high capacitance per unit area and high inductance per unit area using the same dielectric material in a composite structure. $CuFe_2O_4$ films along with $NiFe_2O_4$ films yield results substantially better than prior art $SiO_2$ films. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of forming an integrated L-C structure on a semiconducting substrate, comprising the following steps in the order named:

providing a semiconducting substrate having a first metal layer formed in a pattern comprising an inductor coil and a capacitor bottom electrode;

depositing a metal oxide layer on the semiconducting substrate and over the first metal layer, said metal oxide layer forming a dielectric portion of the L-C structure;

forming a via in the metal oxide layer so that a portion of the inductor coil is exposed by said via;

depositing a second metal layer over the metal oxide layer and in the via, such that the second metal layer is electrically connected to the inductor coil through the via; and forming a pattern in the second metal layer to form a capacitor top electrode over the corresponding capacitor bottom electrode and to form a circuit interconnect to the inductor coil through the via wherein the metal oxide layer is $CuFe_2O_4$.

2. The method as described in claim 1, wherein the step of forming via comprises defining the via by photolithography and then removing portions of the metal oxide layer.

3. The method as described in claim 2, wherein said portions of the metal oxide layer are removed by wet etching.

4. The method as described in claim 2, wherein said portions of the metal oxide layer are removed by plasma etching.

5. The method as described in claim 1, wherein the metal oxide layer serves as a dielectric for the capacitor electrodes and for the inductor coil.

6. The method as described in claim 1, wherein the step of forming a via further comprises forming additional features in the metal oxide layer so that a portion of the capacitor bottom electrode is revealed.

7. A method of forming an integrated L-C structure on a semiconducting substrate, comprising the following steps in the order named:

providing a semiconducting substrate having a first metal oxide layer thereon and wherein the first metal oxide layer is $CuFe_2O_4$;

depositing a first metal layer over the first metal oxide layer and forming a pattern in the first metal layer comprising an inductor coil and a capacitor bottom electrode;

depositing a second metal oxide layer over the first metal oxide layer and over the first metal layer wherein the second metal oxide layer is $CuFe_2O_4$;

forming a via in the second metal oxide layer so that a portion of the inductor coil is exposed by said via;

depositing a second metal layer over the second metal oxide layer and in the via, such that the second metal layer is electrically connected to the inductor coil through the via; and forming a pattern in the second metal layer to form a capacitor top electrode over the corresponding capacitor bottom electrode and to form a circuit interconnect to the inductor coil through the via.

8. The method as described in claim 7, wherein the step of forming a via comprises defining the via by photolithography and then removing portions of the second metal oxide layer.

9. The method as described in claim 8, wherein said portions of the second metal oxide layer are removed by wet etching.

10. The method as described in claim 8, wherein said portions of the second metal oxide layer are removed by plasma etching.

11. The method as described in claim 7, wherein the step of forming a via further comprises forming additional features in the second metal oxide layer so that a portion of the capacitor bottom electrode is revealed.

12. The method as described in claim 7, wherein the step of forming a via further comprises forming additional features in the second metal oxide layer so that a portion of the first metal oxide layer is revealed.

* * * * *